US007126808B2

(12) United States Patent
Koo et al.

(10) Patent No.: US 7,126,808 B2
(45) Date of Patent: Oct. 24, 2006

(54) WAFER PLATEN EQUIPPED WITH ELECTROSTATIC CLAMP, WAFER BACKSIDE GAS COOLING, AND HIGH VOLTAGE OPERATION CAPABILITY FOR PLASMA DOPING

(75) Inventors: Bon-Woong Koo, Andover, MA (US); Bjorn O. Pedersen, Chelmsford, MA (US); Jay T. Scheuer, Rowley, MA (US); Erik A. Mitchell, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 248 days.

(21) Appl. No.: 10/816,289

(22) Filed: Apr. 1, 2004

(65) Prior Publication Data

US 2004/0196616 A1    Oct. 7, 2004

Related U.S. Application Data

(60) Provisional application No. 60/459,515, filed on Apr. 1, 2003.

(51) Int. Cl.
    *H02H 1/00* (2006.01)
(52) U.S. Cl. ................. 361/234; 361/230; 361/233; 279/128
(58) Field of Classification Search ............ 361/234; 279/128
    See application file for complete search history.

(56) References Cited

U.S. PATENT DOCUMENTS 4,473,455 A * 9/1984 Dean et al. ............ 204/298.15
4,551,192 A * 11/1985 Di Milia et al. ......... 156/345.51
4,724,510 A * 2/1988 Wicker et al. ............... 361/234
5,016,332 A * 5/1991 Reichelderfer, deceased et al. ........... 29/25.01
5,077,511 A * 12/1991 George ....................... 318/652
5,131,460 A * 7/1992 Krueger ..................... 165/80.2
5,583,737 A * 12/1996 Collins et al. ............... 361/234
6,454,898 B1 * 9/2002 Collins et al. ........ 118/723 AN
6,716,727 B1 * 4/2004 Walther ...................... 438/514
2002/0121312 A1 * 9/2002 Lubomirsky et al. .......... 141/4

\* cited by examiner

*Primary Examiner*—Stephen W. Jackson
*Assistant Examiner*—Terrence Willoughby

(57) ABSTRACT

An apparatus is provided for handling workpieces, such as semiconductor wafers, during semiconductor processing. The apparatus includes a wafer platen having a plurality of channels each extending from a top surface to a bottom surface of the wafer platen, a plurality of lift pins in alignment with the channels, and a mechanism for engaging the lift pins in a loading position of the workpiece, a clamping position of the workpiece so that desired semiconductor processes may be performed to the workpiece, and a lift off position for removing the workpiece from the wafer platen after the semiconductor processes are completed. The mechanism places the lift pins below the surface of the wafer platen in the load position and then raises the lift pins to a first predetermined distance above the surface of the wafer platen in the clamp position such that the first predetermined distance allows the workpiece to be clamped to the wafer platen. Then, the mechanism places the lift pins at a second predetermined distance above the surface of the wafer platen in the lift off position such that a workpiece removing device, such as a robotic arm, may be positioned between the workpiece and the wafer platen without contacting either surface.

20 Claims, 5 Drawing Sheets

WAFER PLATEN EQUIPPED WITH ELECTROSTATIC CLAMP, WAFER BACKSIDE GAS COOLING, AND HIGH VOLTAGE OPERATION CAPABILITY FOR PLASMA DOPING

RELATED APPLICATIONS

This application claims priority to U.S. provisional application No. 60/459,515, entitled "Wafer Platen Equipped With Electrostatic Clamp," filed on Apr. 1, 2003, naming Bon-Woong Koo, Bjorn Pederson, Jay T. Scheuer and Erik A. Mitchell as inventors, the contents of which are herein incorporated by reference in their entirety.

BACKGROUND (1) Field

The disclosed methods and systems relate generally to semiconductor processing, and more particularly to wafer handling methods and systems utilizing a wafer platen having an electrostatic clamp for plasma doping processes.

(2) Description of Relevant Art

In previous approaches, various methods and materials have been tested in order to provide a good electrical contact between the wafer and the platen, such as utilizing flat metal platens (e.g. Aluminum), spring-loaded sharp/flat pins (e.g. Tungsten, graphite, aluminum), aluminum foil, etc. However, previous approaches have relied on the gravitational force of the wafer which has not provided enough force for penetrating the oxide layer on the wafer. Therefore, problems have arisen such as poor electrical contact between the metal platen and the wafer; poor secondary ion mass spectrometry (SIMS) as-implanted junction depth repeatability; wafer charging damage; micro-discharge between the wafer and the platen; wafer backside particle generation; and excessive wafer temperature increase.

For instance, in prior art systems disclosed in U.S. Patent Publication Nos. 2001/0016302 and 2002/0067585, wafer cooling schemes use an electrostatic chuck. However, these systems fail to address the problems relating to the electrical contact to the wafer and high voltage wafer biasing during backside gas cooling.

In other prior art systems, techniques of residual charge removal for unclamping after processing the wafers are disclosed in U.S. Pat. Nos. 5,117,121; 6,033,482; and 6,567,257 and U.S. Patent Publication No. 2003/0030961. However, each of these systems are problematic due to the fact that complicated circuitry and control systems are required or contamination issues arise due to the use of radiation sources or the like.

The use of partially implanted insulating surfaces to provide both electrical contact and a larger area of thermal contact for wafer cooling purposes is disclosed in U.S. Pat. No. 6,552,892. However, the cooling efficiency is low in the vacuum environment and the insulating surfaces described above typically have relatively low melting temperatures and low chemical resistance which limits its applications. In yet other prior art systems directed to RF applications, such as U.S. Pat. Nos. 6,529,362 and 6,033,482, electrical contact is not required during processing due to the RF driven self-bias effect.

Accordingly, there is a need for improved wafer handling systems utilizing a wafer platen having an electrostatic clamp for improving the electrical contact between the platen and the wafer to increase the wafer cooling capability, suppress the wafer backside discharge and reduce wafer backside particle generation.

SUMMARY

According to a first aspect of the invention, an apparatus is provided for handling workpieces, such as semiconductor wafers, during semiconductor processing. The apparatus comprises a wafer platen including a plurality of channels each extending from a top surface to a bottom surface of the wafer platen, a plurality of lift pins in alignment with the channels, and a mechanism for engaging the lift pins in a loading position of the workpiece, a clamping position of the workpiece so that desired semiconductor processes may be performed to the workpiece, and a lift off position for removing the workpiece from the wafer platen after the semiconductor processes are completed. The mechanism places the lift pins below the surface of the wafer platen in the load position and then raises the lift pins to a first predetermined distance above the surface of the wafer platen in the clamp position such that the first predetermined distance allows the workpiece to be clamped to the wafer platen. Then, the mechanism places the lift pins at a second predetermined distance above the surface of the wafer platen in the lift off position such that a workpiece removing device, such as a robotic arm, may be positioned between the workpiece and the wafer platen without contacting either surface.

In some embodiments, the mechanism for engaging the lift pins comprises first and second cylinders.

In some embodiments, the plurality of lift pins comprises three lift pins. While in other embodiments, the plurality of lift pins comprises more than three lift pins. In yet other embodiments of the present invention, one or two lift pins may be utilized.

In some embodiments, the lift pins comprise pointed tips. In other embodiments, the lift pins comprise flattened tips.

The workpiece handling apparatus may further comprise a gas cooling controller for cooling a backside chamber between the workpiece and the wafer platen. The gas cooling controller may comprise a gas source for supplying gas to the backside chamber, a pressure controller for regulating the pressure of the gas supplied to the backside chamber, an exhaust pump for exhausting gas from the backside chamber and a switch for switching between supplying gas and exhausting gas through a gas feed through in the wafer platen.

According to another aspect of the invention, a method for handling workpieces during semiconductor processing is provided. The method comprises the steps of loading the workpiece on a wafer platen, engaging lift pins through channels of the wafer platen above the surface of the wafer platen for positioning the workpiece in a clamping position, and engaging the lift pins through the channels of the wafer platen to further lift the workpiece above the surface of the wafer platen for positioning the workpiece in a lift off position.

Other objects and advantages will become apparent hereinafter in view of the specification and drawings.

DESCRIPTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

Figure 1:
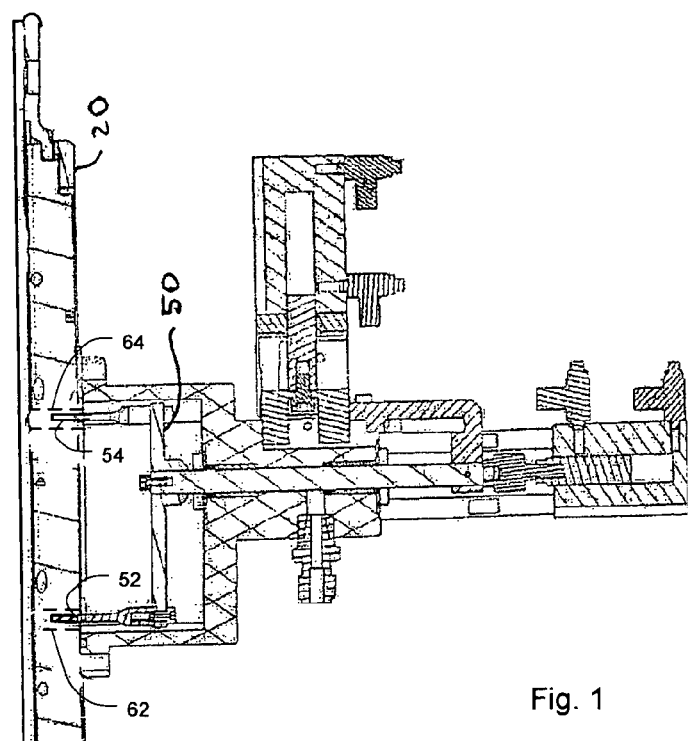
FIG. 1 illustrates a wafer platen having an electrostatic clamp according to an embodiment of the present invention.
Figure 4:
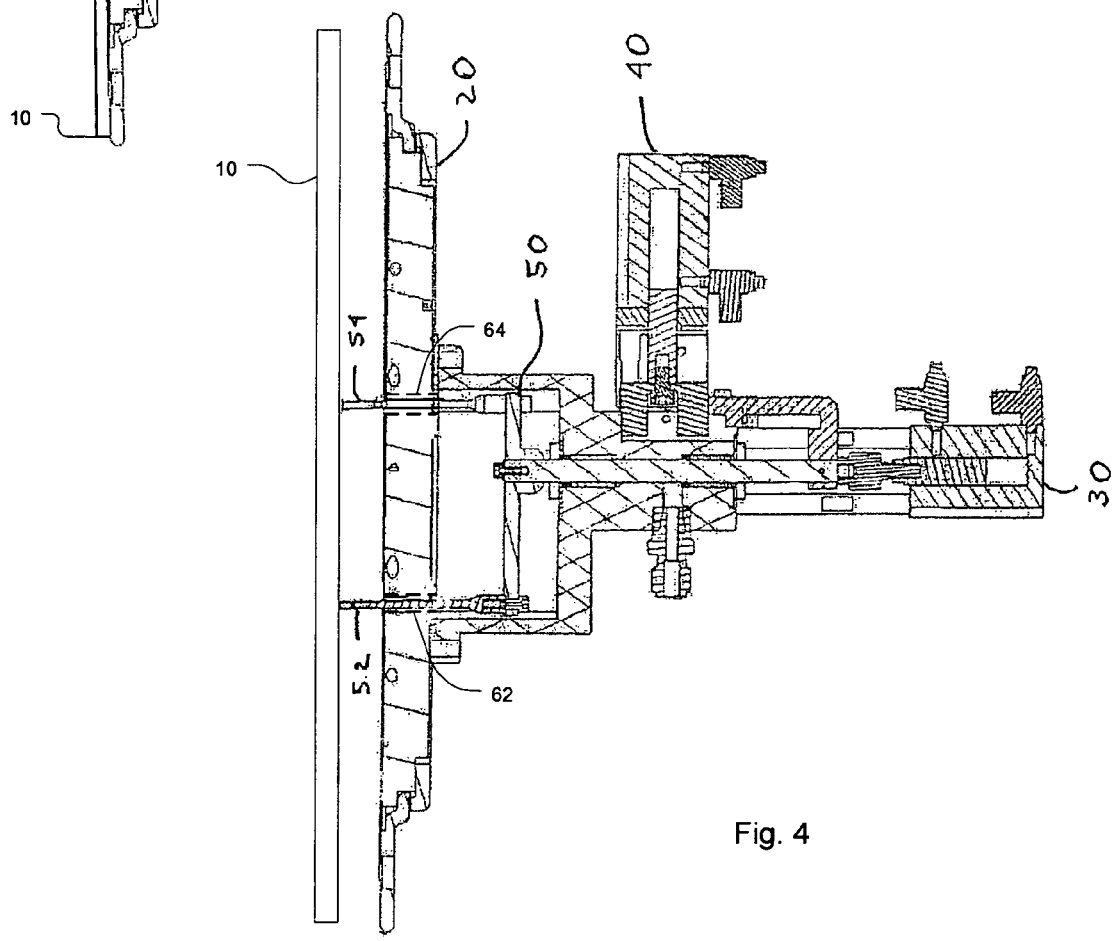
FIG. 4 illustrates a clamping position for the wafer on a wafer platen according to an embodiment of the present invention.
Figure 5:
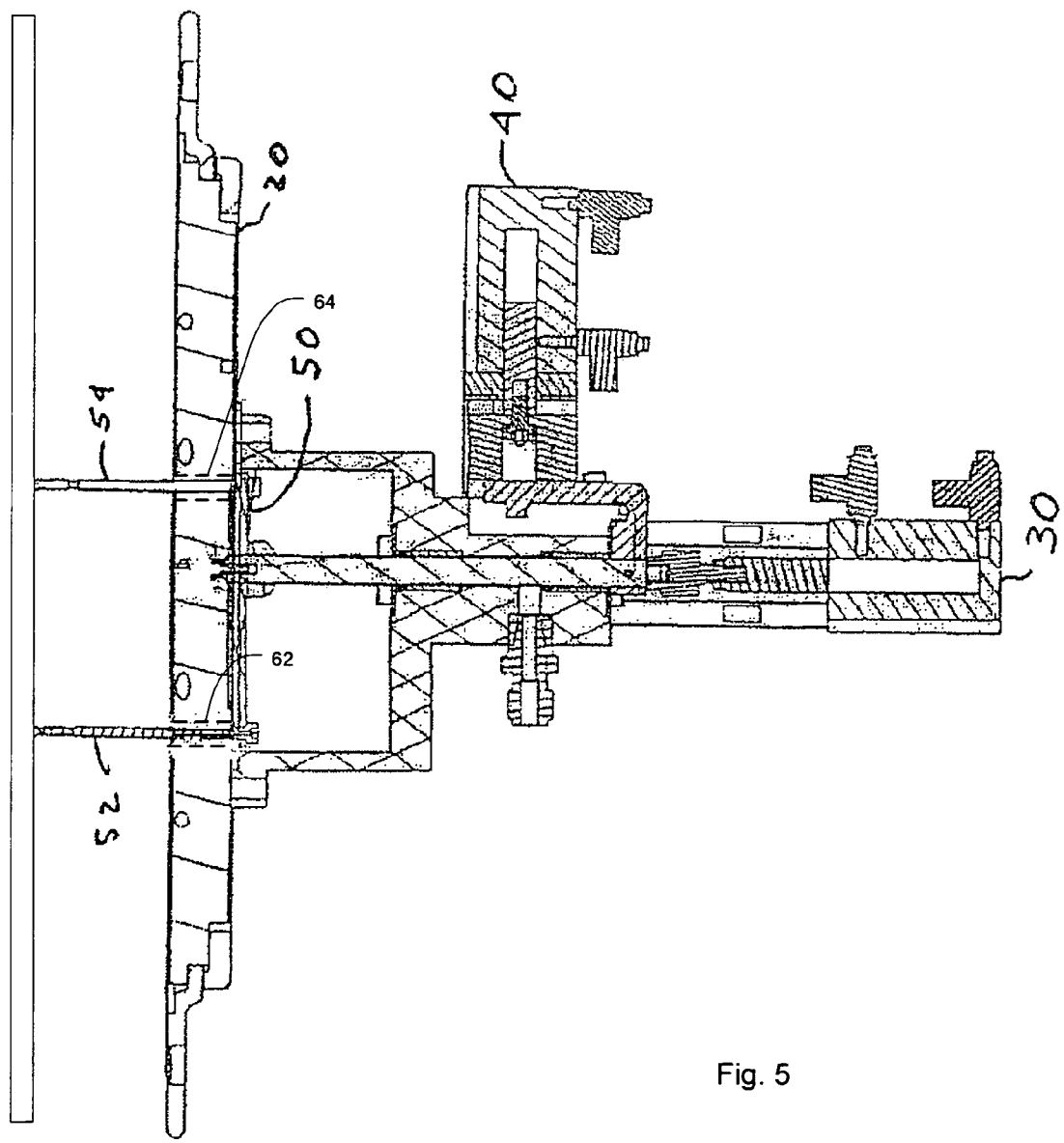
FIG. 5 illustrates a lifting position for the wafer on a wafer platen according to an embodiment of the present invention.

According to an embodiment of the present invention, a wafer handling system is provided which utilizes a wafer platen 1 having an electrostatic clamp. FIGS. 1, 4 and 5 illustrate a workpiece or wafer in various loading and clamping positions as will be described in more detail. In FIG. 1, the wafer handling system is illustrated where a wafer 10 is in a load position on an electrostatic clamp 20. (Note: FIGS. 1, 4 and 5 are not shown to scale.) The electrostatic clamp 20 may be made of alumina or ceramic materials and/or insulating materials and the like. The electrostatic clamp 20 includes a plurality of channels 62, 64 and 66 in which lift pins 52, 54 and 56 may extend therethrough. First and second cylinders 30 and 40 engage a pin housing 50 placed directly below the electrostatic clamp 20 so that the lift pins 52, 54 and 56 may be kept below the surface of the electrostatic clamp 20 and then extend beyond the top surface of the electrostatic clamp 20 during the clamping and lifting off processes. In place of the First and second cylinders 30 and 40, one skilled in the art may realize that a single cylinder and other mechanisms may be utilized for engaging the lift pins 52, 54 and 56 in the various positions.

Figure 2A:
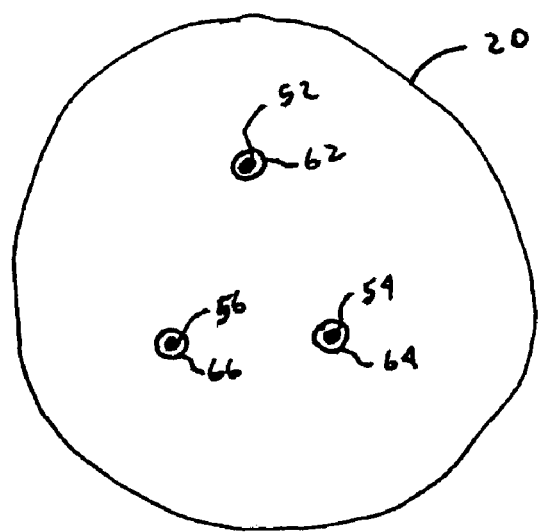
FIGS. 2(a) and 2(b) illustrate tops of wafer platens according to embodiments of the present invention.
Figure 2B:
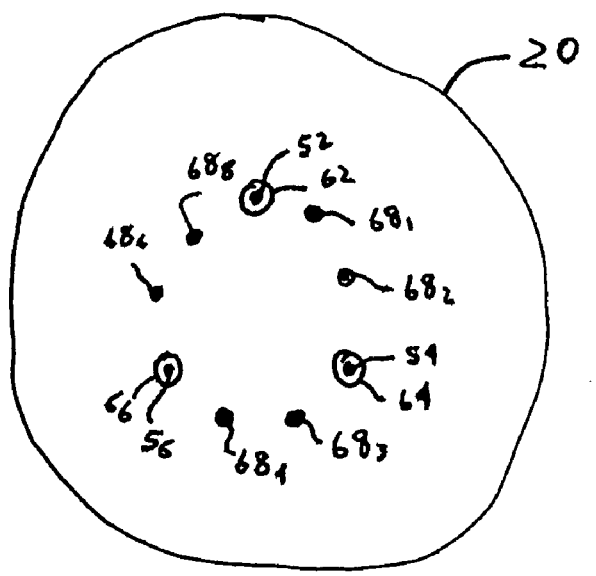

FIGS. 2(a) and 2(b) illustrate top views of wafer platens according to embodiments of the present invention. FIG. 2(a) illustrates three lift pins 52, 54 and 56 in their respective channels 62, 64 and 66 arranged around the surface of the wafer platen 1. Preferably, the three pins 52, 54 and 56 are arranged in a triangular manner and separated to stably hold the wafer 10. To achieve stability of the wafer 10, it is desirable to position each of the three pins 52, 54 and 56 uniformly and evenly spaced at a radius from the center of the wafer platen 1 where the radius is about one half or greater of the radius for the wafer 10 to be held. Also, this arrangement of the three pins 52, 54 and 56 makes wafer handling by the wafer robot or pick easier. However, it will be released by one skilled in the art many different numbers and arrangements of lift pills may be used depending upon the needs of a particular application. For instance, more than three lift pins may be used to increase the stability of the wafer being held. Alternatively, one or two lift pins may be used to hold the wafer to simplify the pick and placement by the water robot or pick. However, if only one or two lift pins are used the stability of the wafer being held will suffer. Accordingly, the surface of the pins should be sufficiently large to balance the wafer.

FIG. 2(b) illustrates another embodiment of the present invention where three lift pins 52, 54 and 56 with their respective channels 62, 64 and 66 are arranged as in FIG. 2(a). However, in the present embodiment, electrical contacts $68_1$, $68_2$, $68_3$, $68_4$, $68_5$, $68_6$ are arranged between the lift pins 52, 54 and 56. The electrical contacts $68_1$–$68_8$ are spring loaded with springs of sufficient force to provide a secure contact to the backside of the wafer 10 for increasing the electrical contact to the wafer 10. The electrical contacts $68_1$–$68_8$ are positioned on the surface of the wafer platen 1 without any channels. Thereby, the electrical contacts do not retract into the wafer platen 1.

Figure 3A:
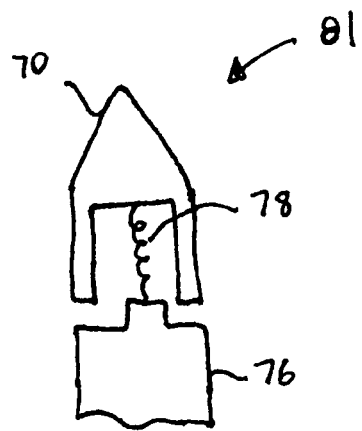
FIGS. 3(a), 3(b) and 3(c) illustrate lift pins that may be utilized according to embodiments of the present invention.
Figure 3B:
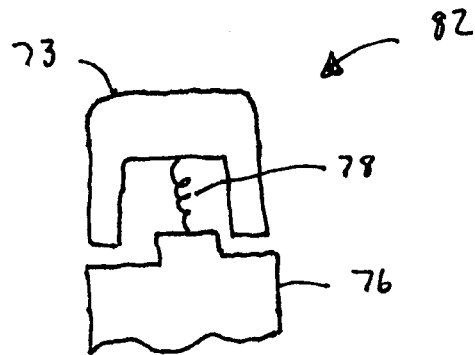
Figure 3C:
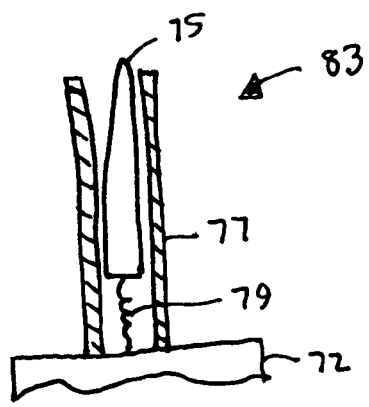

FIG. 3(a), 3(b) and 3(c) illustrate examples of lift pins that may be utilized in various embodiments of the present invention. In FIG. 3(a), a lift pin 81 including a base 76, a spring 78 and a pointed tip 70 are illustrated that may be utilized in one embodiment of the present invention. Alternately, as illustrated in FIG. 3(b), a lift pin 82 including a substantially flat tip 73 may be utilized in another embodiment of the present invention. In yet another embodiment of the present invention as illustrated in FIG. 3(c), a lift pin 83 including a pin 75 guided between a sleeve 77 with a spring 79 connected between the pin 75 and a base 72 may be utilized.

FIG. 4 illustrates the lift pins 52, 54 and 56 being raised above the surface of the electrostatic clamp 20 in response to positioning the first and second cylinders 30 and 40 to a wafer clamping position and applying a bias voltage to the wafer 10 through the lift pins 52, 54 and 56. The first and second cylinders 30 and 40 are set so that the backside of the wafer 10 is sufficiently contacted by the pins 52, 54 and 56 through any oxide layers thereon without raising the wafer 10 beyond the electrostatic clamping capabilities. The distance that the lift pins 52, 54 and 56 extend above the surface of the wafer 10 is determined by a combination of factors such as the force of the springs in the lift pins, the bias voltage and the pressure subjected to the backside of the wafer 10. A high bias voltage may be supplied to the wafer 10 through the pins 52 and 54.

FIG. 5 illustrates the wafer 10 next being raised by the lift pins 52, 54 and 56 by further engaging the cylinders 30 and 40 to a lift off position. In the lift off position, the lift pins 52, 54 and 56 are raised higher above the surface of the clamp 20 than in the clamping position so that a wafer pick or robot (not shown) may be placed between the wafer 10 and the clamp 20 without coming into contact with the wafer 10 or the clamp 20. Then, the wafer pick may be gently raised to lift off the wafer from the clamp without damaging the wafer 10.

The wafer handling system according to the embodiments of the present invention general includes loading the wafer onto the platen. Next, the wafer is clamped onto the wafer through the electrostatic clamp by applying a bias voltage and pressurizing a backside chamber area between the wafer and the electrostatic clamp. The desired semiconductor processes are then performed to the wafer once the wafer is sufficiently clamped. Once the processing is completed, the backside chamber is exhausted and the wafer is unclamped from the electrostatic clamp. Next, the wafer is positioned in the lift off position and unloaded and the system is available for another wafer or workpiece to be processed.

Figure 6:
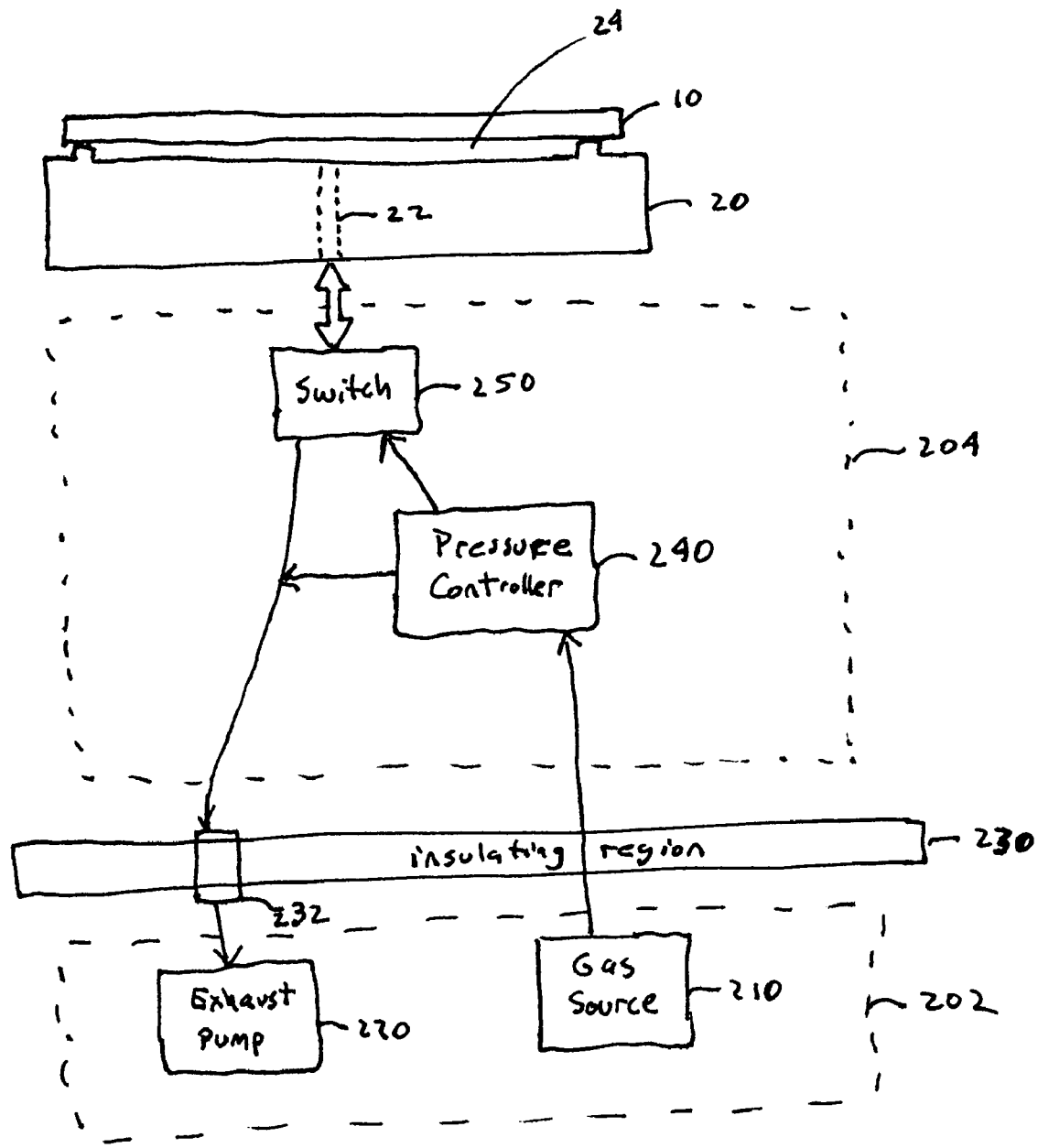
FIG. 6 illustrates a gas cooling system for a wafer platen according to an embodiment of the present invention.

FIG. 6 illustrates an example of a gas cooling system for the wafer handling system according to an embodiment of the present invention. When the wafer 10 is clamped to the electrostatic clamp 20, a gas feed through 22 connects the gas cooling system with a backside chamber between the wafer 10 and the electrostatic clamp 20. The gas cooling system includes a gas source 210 for supplying gas from a ground potential region 202 through an insulating region 230 to a high voltage region 204. The gas source 210 is connected to a pressure controller 240 and a switch 250 for regulating the pressure of gas through the gas feed through 22 to the backside chamber 24. The switch 250, such as a shuttle valve for example, is switched to allow gas to be supplied towards the backside chamber 24. When gas is to be exhausted from the backside chamber 24. The position of the switch 250 is changed to allow gas to flow from the backside chamber 24 to be exhausted by an exhaust pump 220. Responsive to this position of the switch 250 and the exhaust pump 220, the gas flow during the exhaust process proceeds from the high voltage region 204 through an isolator 232 of the insulating region 230 to the ground potential region 202. The isolator 232 prevents gas breakdown between the high voltage and ground potential. The pressure controller 240 includes a path to the exhaust flow which allows gas bleeding therefrom to maintain the desired pressure changes and variations by the pressure controller. The gas cooling system described above is just one example of such a system and one skilled in the art can realize many variations of such a system for cooling the backside of the wafer.

The primary application for the present invention is for plasma doping. However, applications can be extended to other pulsed plasma processing applications such as plasma etching and plasma enhanced chemical vapor deposition.

In plasma doping (PLAD) approaches, the ion implantation energies are determined by DC or pulsed DC bias voltages applied to the wafer at a range typically between 0.05 and 50 kV. In previous approaches, the wafer bias has been applied either through a metal platen or through sharp metal pins on which the wafer is positioned by gravitational force. However, problems in these previous approaches include poor electrical contact between the metal platen or sharp contact pins and the wafer which cause poor as-implanted SIMS junction depth repeatability, wafer charging damage (charge accumulation on the wafer which causes breakdown), discharge between the wafer and the platen, and wafer backside particle generation; and excessive wafer temperature increase.

PLAD is an attractive method for forming ultra-shallow junctions (USJ) in semiconductor wafers because it is capable of high dose rates at low energies. In PLAD approaches, the bias voltage applied to the wafer, typically at a range between 0.05 and 50 kV, determines the ion implantation energy. The present invention is directed to solving the problems of the previous approaches by providing a PLAD wafer platen equipped with an electrostatic clamp, gas cooling system and high voltage isolation capability. The important features of the platen according to the present invention include improving SIMS as-implanted junction depth repeatability and reducing wafer charging damage due to improved electrical contact between the platen and the wafer, increasing the wafer cooling capability during the high voltage (high energy) operation, suppressing the wafer backside discharge, reducing wafer backside particle generation and fulfilling the wafer contact function by dual stroke lift pins.

As semiconductor device size shrinks, tight control of implanted energy and good electrical contact between the platen and the wafer are essential in order to achieve the desired PLAD performance. For instance, good as-implanted junction depth repeatability (<2%), improved wafer potential monitoring and control, minimized wafer charging damage, suppression of the wafer backside discharge, reduction of wafer backside particles and wafer cooling capability for high energy, high throughput implantation are desired.

Three or more forced contact lift pins, made of tungsten or hardened materials, may be used for the electrical contact between the platen and the wafer for applications utilizing pointed lift pins. Also, aluminum, titanium or other softer materials may be used for applications utilizing lift pins having a substantially flat surface. The forced contact pins are also used as wafer lifters before and after the PLAD processing. The distinction between the wafer contact positioning (for PLAD processing) and the wafer lift positioning (for wafer cycling) is accomplished using a stop or multi-stroke cylinder. One of the contact pins may be electrically isolated to provide a voltage feedback for control of implant depth.

The surface of the electrostatic clamp 20 may be made of an insulator (typically $Al_2O_3$) although other insulative materials may be used. This reduces wafer backside discharge and therefore minimizes backside and frontside particle generation.

High voltage, high throughput PLAD operation (up to 50 kV) requires wafer backside cooling (typically using Helium gas<20 Torr). A commercial high voltage isolator fitting in the vacuum line from the cooling gas system provides electrical isolation. Differential pumping reduces the pressure inside the isolator to be less than 10 mTorr while the wafer backside pressure is kept at <20 Torr, and the isolation gap (<1") is shorter than the ionization mean free path.

The wafer clamping voltage is variable (0 to +/−2000V) in order to reduce the backside particle generation during the clamping/unclamping periods and also to adjust the unclamping time.

The wafer platen according to an embodiment of the present invention prevents deformation in the wafer bias pulse shape. Also, the as-implanted SIMS junction depth repeatability improved by two times when combined with controlled plasma conditions and the overall as-implanted SIMS junction depth repeatability was <2%. Furthermore, no wafer backside discharge was observed and the high voltage isolation through the isolator was >40 kV.

In another embodiment of the present invention, the electrostatic clamp provides wafer clamping with an electrical contact in a high voltage environment for pulsed DC bias conditions up to 50 kV. Arcing of the backside gas feed and exhaust, mostly helium, is prevented at this high voltage pulsed DC bias condition. The present invention allows the wafer to be unclamped without residual charging affecting this step because the pins are contacted during and after wafer processing which removes residual charges quickly and minimizes the waiting time before lifting the wafer.

Many additional changes in the details, materials, and arrangement of parts, herein described and illustrated, can be made by those skilled in the art. Accordingly, it will be understood that the present invention is not to be limited to the embodiments disclosed herein, can include practices otherwise than specifically described, and are to be interpreted as broadly as allowed under the law.

What is claimed is:

1. An apparatus for handling a workpiece during semiconductor processing, comprising:
   a wafer platen including a plurality of channels each extending from a top surface to a bottom surface of the wafer platen;
   a plurality of lift pins in alignment with the channels; and
   a mechanism for engaging the lift pins in a loading position of the workpiece, a clamping position for placing the workpiece in a position so that desired semiconductor processes may be performed to the workpiece, and a lift off position for removing the workpiece from the wafer platen after the desired semiconductor processes are completed, wherein each of the plurality of lift pins are also configured to provide a path for supplying a bias voltage from a bias source to the workpiece on the wafer platen said bias voltage having a potential not equal to ground potential.

2. An apparatus for handling a workpiece as defined in claim 1, wherein the mechanism places the lift pins below the top surface of the wafer platen in the load position.

3. An apparatus for handling a workpiece as defined in claim 1, wherein the mechanism places the workpiece at a distance above the surface of the wafer platen in the lift off position, the distance allowing a workpiece removing device to be positioned between the workpiece and the wafer platen without contacting either surface.

4. An apparatus for handling a workpiece as defined in claim 3, wherein the workpiece removing device comprises a robotic arm.

5. An apparatus for handling a workpiece as defined in claim 1, wherein the mechanism comprises first and second cylinders for engaging the lift pins in the load, clamp and lift off positions.

6. An apparatus for handling a workpiece as defined in claim 1, wherein the plurality of lift pins comprise three lift pins.

7. An apparatus for handling a workpiece as defined in claim 6, wherein the three lift pins are arranged in a triangular manner to stably support the workpiece.

8. An apparatus for handling a workpiece as defined in claim 1, wherein the plurality of lift pins comprise more than three lift pins.

9. An apparatus for handling a workpiece as defined in claim 1, wherein the lift pins comprise pointed tips.

10. An apparatus for handling a workpiece as defined in claim 1, wherein the lift pins comprise flattened tips.

11. An apparatus for handling a workpiece as defined in claim 1, wherein the lift pins comprise tungsten, aluminum, carbide, aluminum, nitride, graphite or titanium.

12. An apparatus for handling a workpiece as defined in claim 1, wherein the wafer platen comprises aluminum or ceramic materials.

13. An apparatus for handling a workpiece as defined in claim 1, further comprising a gas cooling controller for cooling a backside chamber between the workpiece and the wafer platen.

14. An apparatus for handling a workpiece as defined in claim 13, wherein the gas cooling controller comprises a gas source for supplying gas to the backside chamber, a pressure controller for regulating the pressure of the gas supplied to the backside chamber, an exhaust pump for exhausting gas from the backside chamber and a switch for switching between supplying gas and exhausting gas through a gas feed through in the wafer platen.

15. An apparatus for handling a workpiece as defined in claim 1, further comprising a plurality of electrical contacts on the top surface of the wafer platen.

16. A method for handling a workpiece during semiconductor processing, comprising:
   loading the workpiece on a wafer platen;
   engaging lift pins through channels of the wafer platen each extending from a top surface to a bottom surface of the wafer platen for positioning the workpiece in a clamping position;
   engaging the lift pins through the channels of the wafer platen to lift the workpiece above the surface of the wafer platen for positioning the workpiece in a lift off position; and
   supplying a bias voltage from a bias source to the workpiece through the lift pins said bias voltage having a potential not equal to ground potential.

17. A method for handling the workpiece as defined in claim 16, wherein the lift pins are placed below the surface of the wafer platen during the loading of the workpiece on the wafer platen.

18. An apparatus for handling a workpiece as defined in claim 1, wherein the desired semiconductor processes performed when the workpiece is in the clamped position comprises a plasma doping of ions into the workpiece.

19. An apparatus for handling a workpiece as defined in claim 18, wherein the bias voltage supplied to the workpiece determines an ion implantation energy of the ions.

20. An apparatus for handling a workpiece as defined in claim 19, wherein the bias voltage comprises a pulsed DC bias voltage.

* * * * *